United States Patent
Irino et al.

(10) Patent No.: US 6,477,694 B1
(45) Date of Patent: Nov. 5, 2002

(54) METHOD FOR DESIGNING A POWER SUPPLY DECOUPLING CIRCUIT

(75) Inventors: Hitoshi Irino; Noriaki Ando; Hiroshi Wabuka; Hirokazu Tohya, all of Tokyo (JP)

(73) Assignee: NEC Corp. (JP)

( * ) Notice: Subject to any disclaimer, the term of this patent is extended or adjusted under 35 U.S.C. 154(b) by 173 days.

(21) Appl. No.: 09/698,588

(22) Filed: Oct. 27, 2000

(30) Foreign Application Priority Data

Oct. 28, 1999 (JP) .......................................... 11-307483

(51) Int. Cl.$^7$ ............................................. G06F 17/50
(52) U.S. Cl. ................. 716/15; 716/8; 716/11; 716/12; 438/129; 257/208; 257/347; 257/369; 257/691
(58) Field of Search ....................... 716/1–21; 438/129; 257/208, 347, 369, 691

(56) References Cited

U.S. PATENT DOCUMENTS

| | | | | |
|---|---|---|---|---|
| 4,714,981 A | * | 12/1987 | Gordon | 174/52.4 |
| 4,752,887 A | * | 6/1988 | Kuwahara | 716/15 |
| 4,878,155 A | * | 10/1989 | Conley | 174/263 |
| 5,526,313 A | * | 6/1996 | Etoh et al. | 365/190 |
| 5,646,572 A | * | 7/1997 | Masleid | 327/143 |
| 5,731,960 A | * | 3/1998 | Fung | 174/260 |
| 6,075,211 A | * | 6/2000 | Tohya et al. | 174/255 |
| 6,111,479 A | * | 8/2000 | Myohga et al. | 333/184 |
| 6,121,659 A | * | 9/2000 | Christensen et al. | 257/347 |
| 6,140,885 A | * | 10/2000 | Abadeer et al. | 327/333 |
| 6,222,260 B1 | * | 4/2001 | Liang et al. | 257/666 |
| 6,232,154 B1 | * | 5/2001 | Reith et al. | 257/401 |
| 6,305,002 B1 | * | 10/2001 | Uchida | 716/10 |
| 6,353,248 B1 | * | 3/2002 | Reith et al. | 257/368 |
| 6,359,237 B1 | * | 3/2002 | Tohya et al. | 174/255 |
| 2001/0018761 A1 | * | 8/2001 | Sasaki et al. | 716/15 |
| 2001/0039643 A1 | * | 11/2001 | Kuroda et al. | 716/11 |
| 2002/0002700 A1 | * | 1/2002 | Inui et al. | 716/8 |
| 2002/0045995 A1 | * | 4/2002 | Shimazaki et al. | 702/77 |

FOREIGN PATENT DOCUMENTS

| | | |
|---|---|---|
| JP | 9-139573 | 5/1997 |
| JP | 10-97560 | 4/1998 |
| JP | 11-15870 | 1/1999 |

\* cited by examiner

Primary Examiner—Vuthe Sier
Assistant Examiner—Andrea Liu
(74) Attorney, Agent, or Firm—Dickstein, Shapiro, Morin & Oshinsky, LLP.

(57) ABSTRACT

A design support system 100 according to the present invention comprises: an LSI library 10, in which rated characteristics of various LSIs are stored by an LSI library preparation unit 70; a decoupling capacitor library 20, in which rated characteristics of various capacitors are stored; a PCB library 30, in which the cross-sectional structures of various power wiring lines are stored; a decoupling capacitor search unit 40, for employing the LSI library 10 and the decoupling capacitor library 20; a power wiring determination unit 50, for employing the results obtained by the decoupling capacitor search unit 40, the LSI library 10 and the PCB library 30; and a design results output unit 60, for outputting the results received from the power wiring determination unit 50. Furthermore, the data in the three libraries can be updated or new data can be added.

8 Claims, 11 Drawing Sheets

METHOD FOR DESIGNING A POWER SUPPLY DECOUPLING CIRCUIT

BACKGROUND OF THE INVENTION

1. Field of the Invention

The present invention relates to a method for designing a power supply decoupling circuit that employs power wiring of a printed circuit board as an inductor.

2. Description of the Prior Art

Generally, signal wiring for a digital circuit tends to propagate unwanted electromagnetic waves around the circuit and to cause electromagnetic interference (hereinafter referred to as EMI). Especially when a multi-layer printed circuit board is employed, the power supply system, which includes a power source layer and a ground layer, tends to serve as an oscillator and to produce electromagnetic waves. Therefore, when a power supply system is designed, it is important that it include some countermeasure for preventing unwanted oscillations, and above all, the decoupling circuit is well known as an electrical circuit that has been used to effectively reduce EMI.

For example, in Japanese Unexamined Patent Publications No. Hei 10-97560 and No. Hei 11-15870 design support systems are disclosed in which, for each, an EMI countermeasure is implemented by including a power supply decoupling capacitor (hereinafter referred to as a decoupling capacitor). According to these systems, the wiring layout of a printed circuit board is depicted in a drawing to permit a viewer to visually apprehend the effective range of an arrangement that includes a decoupling capacitor. However, according to the conventional art, no consideration is given to providing a method for selecting an appropriate decoupling capacitor for a large-scale integrated circuit (hereinafter referred to as an LSI) on a printed circuit board.

When the power supply decoupling circuit is constituted by a decoupling capacitor, most of the high-frequency elements of a power source current that operates an LSI is supplied by the decoupling capacitor, and the volumes of the electric charges differ greatly, depending on the circuit structure and the size of the LSI circuit. Thus, an effective procedure is for a decoupling capacitor to be selected for each LSI, and generally, for the printed circuit board designer to be in charge of designing the decoupling capacitor, which is based on the circuit structure of an LSI.

However, it is normal for the circuit information for an LSI to not be opened to the public by a printed circuit board designer, and currently, even if another designer obtains the LSI circuit data, that designer does not have a specific index for designing a decoupling capacitor. Furthermore, since multiple LSIs are mounted on a printed circuit board, the determination of an appropriate decoupling capacitor for each LSI is a very troublesome task.

As another conventional example, a multi-layer printed circuit board is disclosed in Japanese Unexamined Patent Publication No. Hei 9-139573. In this example, a power supply layer, which is generally a flat plate, is constituted by a power wiring network, and a direct current having a high frequency is supplied to each LSI via this network. According to this example, a power supply decoupling inductor (hereinafter referred to as a decoupling inductor), which is parasitic relative to the power wiring, prevents a high frequency direct current from flowing across the power wiring network, and reduces the production of electromagnetic waves by a power supply system.

However, unlike the employment of the flat plate of the power supply layer, the length of a power wiring line must be determined for the power terminal of each LSI when a multi-layer printed circuit board is designed, and since a method for determining what wiring length is to be used is not described in the above conventional example, the design of the power wiring is difficult.

For example, from the viewpoint of the designer of an EMI countermeasure, since the area available on a printed circuit board is ordinarily limited, generally, only the minimum possible wiring length is available for use. Whereas, on the other hand, to reduce EMI an extended wiring length is required. Therefore, an optimal wiring length must be determined when an LSI and a printed circuit board are designed, and this makes the design of power supply wiring an extremely difficult task.

In addition, as well as when a decoupling capacitor is employed, a high frequency direct current that flows across a power supply system is greatly dependant on the circuit structure of an LSI, and therefore, a direct current and an inductance must be determined in advance for each power line. Thus, since the number of LSIs mounted on printed circuit boards is constantly increasing, year by year, the individual wiring layouts have become highly complicated and their design involves the expenditure of a-great deal of effort.

As is described above, if a power supply decoupling circuit is designed using these conventional examples, the capacitance of the decoupling capacitor and the inductance of the power wiring are increased for the power terminal of each LSI, and the propagation of electromagnetic waves can be effectively reduced. However, the occurrence of a variety of the above mentioned shortcomings can not be avoided, and it is technically important that a method for effectively resolving these problems be found.

Specifically, first, a capacitance required for a decoupling capacitor must be rendered easier to design. To do this, even when multiple LSIs are mounted on a printed circuit board, an index for determining the capacitance of a decoupling capacitor, prepared while taking each LSI into account, must be provided a designer.

Second, the length of a power line, which is used as a decoupling inductor, must be easy to obtain, and the layout of the power wiring must be easy to design. To do this, an index for determining the length of a power line must also be provided for a designer.

SUMMARY OF THE INVENTION

It is, therefore, one objective of the present invention is to provide a method for designing a power supply decoupling circuit for which a power supply system, which reduces unwanted electromagnetic wave irradiation, can be easily designed when the design of a printed circuit board is automated.

To achieve this objective, in accordance with the present invention, a power supply decoupling circuit design method, for a printed circuit board wiring pattern for power wiring, which is extended from a power terminal of a semiconductor integrated circuit to a power supply layer or to a main power line, for a printed circuit board to which a direct current is supplied by one of the power supply layers and the main power line, and for designing a power decoupling capacitor that is located between the power terminal and either a ground layer or ground wiring for the printed circuit board, comprises the steps of:

setting, in advance, an electric charge that flows from a direct current power source to the power terminal in response to the operation of the semiconductor integrated circuit, a direct current voltage for the direct current and a terminal voltage for the power terminal, a permissible voltage change in the power supply decoupling circuit, and a ratio for a current reduction in a high frequency element that is accompanied by the operation of the semiconductor integrated circuit;

dividing the electric charge by the terminal voltage to obtain a load capacitance for the semiconductor integrated circuit;

multiplying the direct current voltage by the load capacitance and dividing the product by the permissible voltage change;

designing the power supply decoupling capacitor using the results of the division;

multiplying the current reduction ratio by an impedance obtained from the power supply decoupling capacitor; and designing the printed circuit board wiring pattern using a power supply decoupling inductor obtained by applying the results of the multiplication.

BRIEF DESCRIPTION OF THE DRAWINGS

The above-mentioned and other objectives, features and advantages of this invention will become more apparent when the accompanying drawings are referred to during the course of the following detailed description of the invention, wherein.

DETAILED DESCRIPTION OF THE PREFERRED EMBODIMENT

The preferred embodiment of the present invention will now be described while referring to the accompanying drawings.

Figure 1:
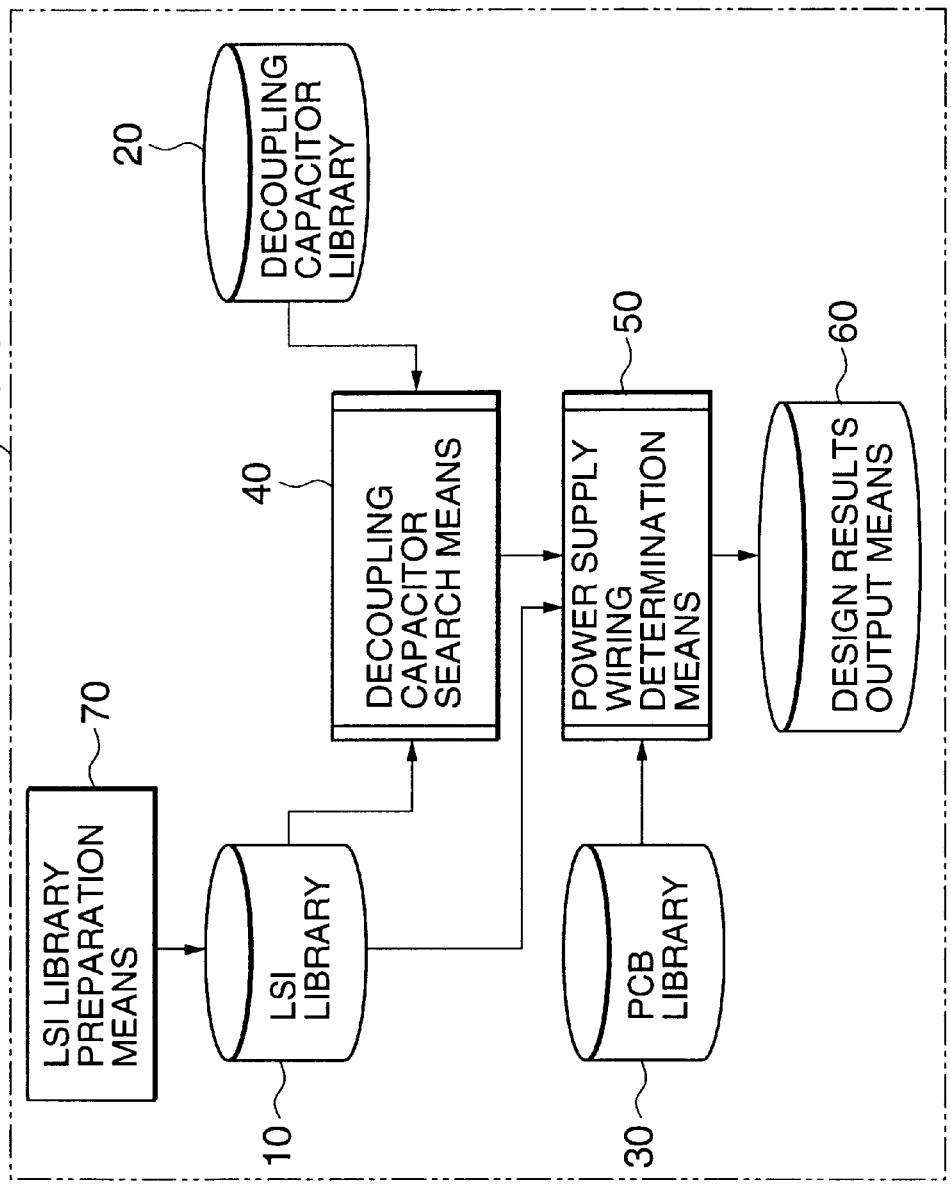
FIG. 1 is a block diagram illustrating an example arrangement for a design support system for a power supply decoupling circuit according to one embodiment of the present invention.

FIG. 1 is a block diagram illustrating an example arrangement for a design support system for a power supply decoupling circuit 100 according to the embodiment of the present invention.

In this embodiment, the system 100 comprises: an LSI library 10, in which rated characteristics of various LSIs are stored; a decoupling capacitor library 20, in which rated characteristics of various capacitors are stored; and a PCB library 30, in which the cross-sectional structures of various power wiring lines are stored.

The design support system also comprises: a decoupling capacitor search unit 40, for employing the LSI library 10 and the decoupling capacitor library 20; a power wiring determination unit 50, for employing the results obtained by the decoupling capacitor search unit 40, the LSI library 10 and the PCB library 30; and a design results output unit 60, for outputting the results received from the power wiring determination unit 50. The data in the three libraries can be updated or new data can be added.

An LSI library preparation unit 70 is provided for the LSI library 10, and for each LSI mounted on a printed circuit board, the LSI library preparation unit 70 registers in advance the name of a part, the name of a power supply terminal, a power supply voltage VDD, an LSI load capacitance Ce, and an average consumed current Iave. The part name and the power supply terminal name include their numbers, and when one LSI includes multiple power supply terminals, the information is prepared for each of the terminals.

The load capacitance Ce is defined as either an internal load capacitance Ci, for each gate circuit of the LSI, or an external load capacitance Co, which is applied to the LSI output terminal, or as the sum of these load capacitances. For example, for an LSI constituted by CMOS, it is important for the focus to be placed on the gate circuit.

Figure 2:
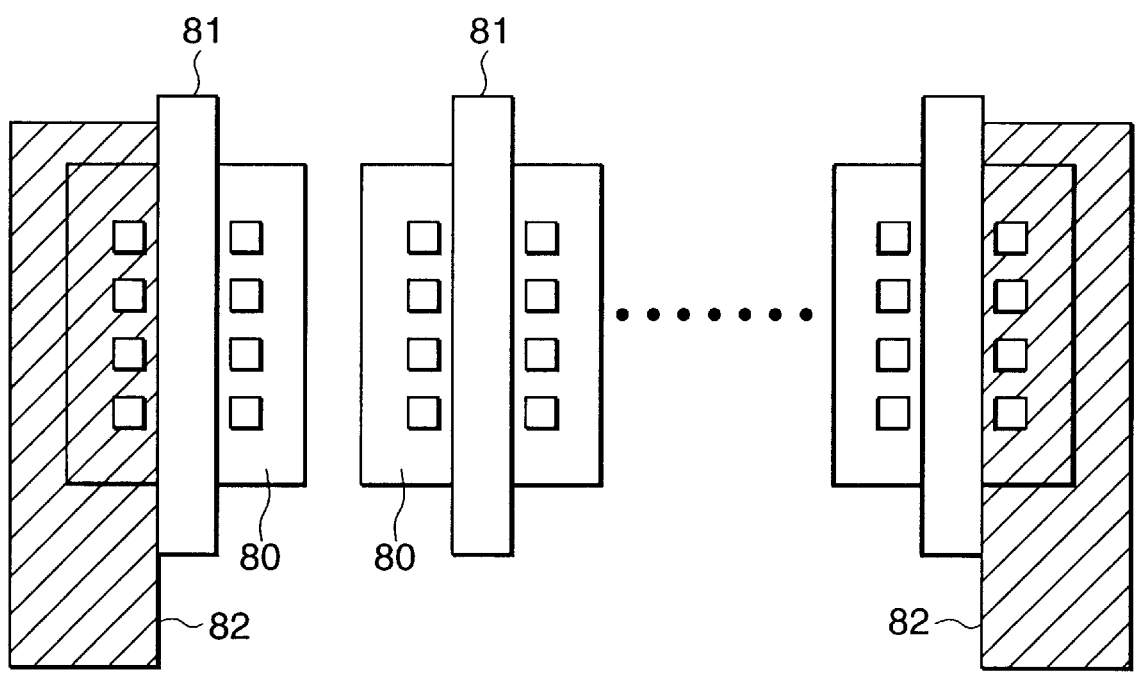
FIG. 2 is a specific diagram showing an example wiring area for an LSI.

FIG. 2 is a specific diagram showing an example wiring area for the LSI, and is used for explaining the information stored in the LSI library 10 shown in FIG. 1.

For each LSI 80 on the printed circuit board, a gate electrode area 81, for an internal gate circuit, and an internal wiring area 82 can be designated LSI layout information. Therefore, the gate electrode area 81, the internal wiring area 82 and a capacitance for each unit area are employed to obtain an internal load capacitance Ci, which is based on the LSI layout information. The internal load capacitance Ci for each power terminal of each internal gate circuit is registered in the LSI library 10.

An external load capacitance Co for the LSI is determined by reading in advance, from an LSI catalog, a load capacitance that is externally applied to the LSI, or by measuring a load capacitance applied to the output terminal of the LSI on a printed circuit board that has been prepared. As another method, a circuit portion that provides the load capacitance for each gate circuit inside the LSI may be extracted from circuit information, such as a SPICE net list, and the load capacitance for each gate circuit may be obtained for the circuit portion.

Figure 3:
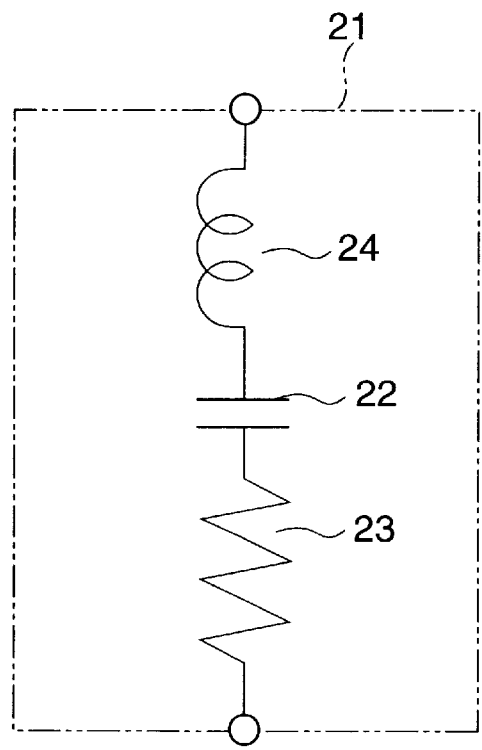
FIG. 3 is a diagram showing an equivalent circuit model for a decoupling capacitor.

FIG. 3 is a diagram showing an equivalent circuit model for a decoupling capacitor and is used to explain the information stored in the decoupling capacitor library 20 shown in FIG. 1.

As an equivalent circuit model for a decoupling capacitor 21, a capacitor 22 (capacitance Cp), a resistor 23 (resistance Rp) and an inductor 24 (inductance Lp) are connected in series.

Therefore, in this model, the part number of each decoupling capacitor, the capacitance Cp, the resistance Rp and the inductance Lp are designated, and are registered in advance in the decoupling capacitor library 20 for each decoupling capacitor.

Figure 4A:
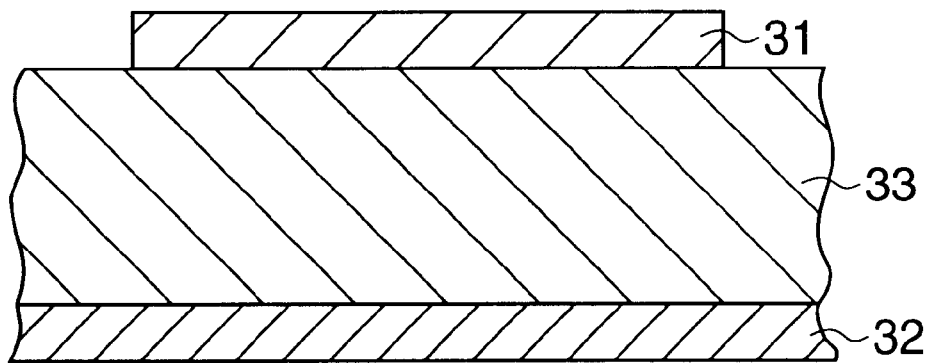
FIGS. 4A and 4B are cross-sectional views of a printed circuit board.
Figure 4B:
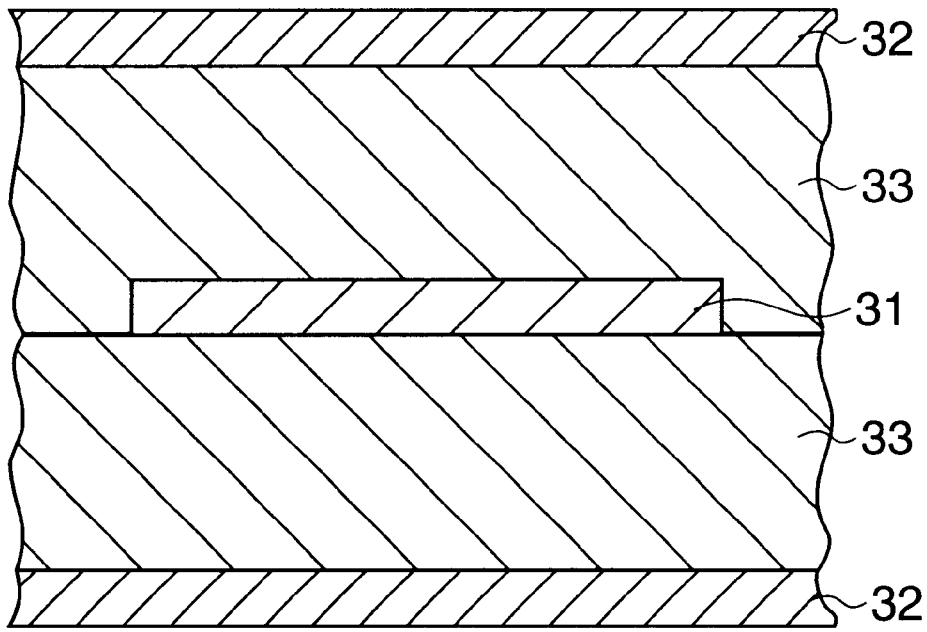

FIGS. 4A and 4b are cross-sectional views of a printed circuit board and are used to explain the information stored in the PCB library 30 shown in FIG. 1.

In the cross-sectional structure of the printed circuit board, a power supply conductive layer 31, for a power wiring network, and a ground conductive layer 32, for a ground layer, and dielectric layers 33 sandwiched between the layers 31 and 32 are laminated.

In a micro-strip line path structure in FIG. 4A, the power supply conductive layer 31 is formed on one of the faces of the dielectric layer 33 that is being sandwiched, and the ground conductive layer 32 is formed on the other face. In the general strip line path structure in FIG. 4b, both faces of the power supply conductive layer 31 are sandwiched between dielectric layers 33, and the ground conductive layers 32 are laminated on the outer faces of the dielectric layers 33 to provide a two-layer structure.

The power supply conductive layer 31 is connected to the power supply terminal of each LSI to form the power supply wiring, and serves as the decoupling inductor. Therefore, when the inductance for the unit length of the power supply conductive layer 31 is calculated in accordance with the cross-sectional structure of the printed circuit board, the obtained inductance can be defined as a unit inductance Lunit for the power wiring.

For example, a thickness t of the power supply conducive layer 31, a wiring width W, a thickness h of the dielectric layer 33, a relative permittivity $\in r$, and a relative permeability $\mu r$ can be employed to directly obtain the unit inductance through numerical calculations performed using the finite-element method, or by simply using a predetermined equation. The unit inductance Lunit of the power supply conductive layer 31 is registered in advance, in the PCB library 30, as power wiring information for each cross-sectional structure of the power wiring. The preparation process has been described, and the individual units used for specific designs will now be described.

Figure 5:
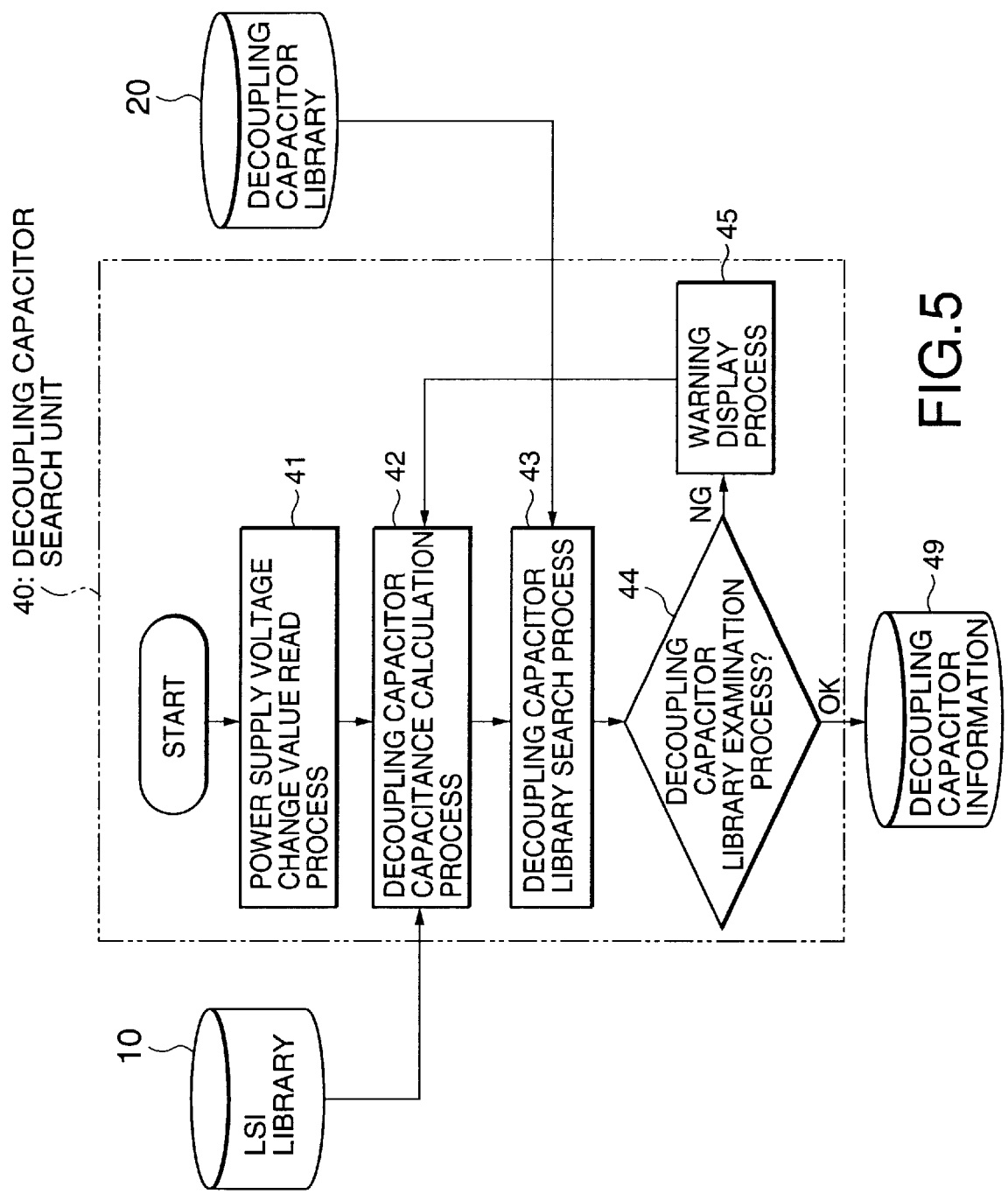
FIG. 5 is a flowchart showing the processing performed by a decoupling capacitor searching means shown in FIG. 1.

FIG. 5 is a flowchart showing the processing performed by the decoupling capacitor search unit 40 shown in FIG. 1.

The decoupling capacitor search unit 40 performs a power supply voltage change value read process 41; a decoupling capacitor capacitance calculation process 42, for employing the LSI library 10 and the results obtained in the power supply voltage change value read process 41; and a decoupling capacitor library search process 43, for employing the decoupling capacitor library 20 and the results obtained by the decoupling capacitor capacitance calculation process 42.

Further, the decoupling capacitor search unit 40 also performs a decoupling capacitor library examination process 44, for employing the results obtained in the decoupling capacitor library search process 43; and a warning display process 45, for employing the results obtained in the decoupling capacitor library examination process 44. The decoupling capacitor capacitance calculation process 42 is repeated in accordance with the contents of the warning displayed as a result of the decoupling capacitor library examination process 44, and the results obtained in the decoupling capacitor library inspection process 44 is used as decoupling capacitor information 49.

Figure 6:
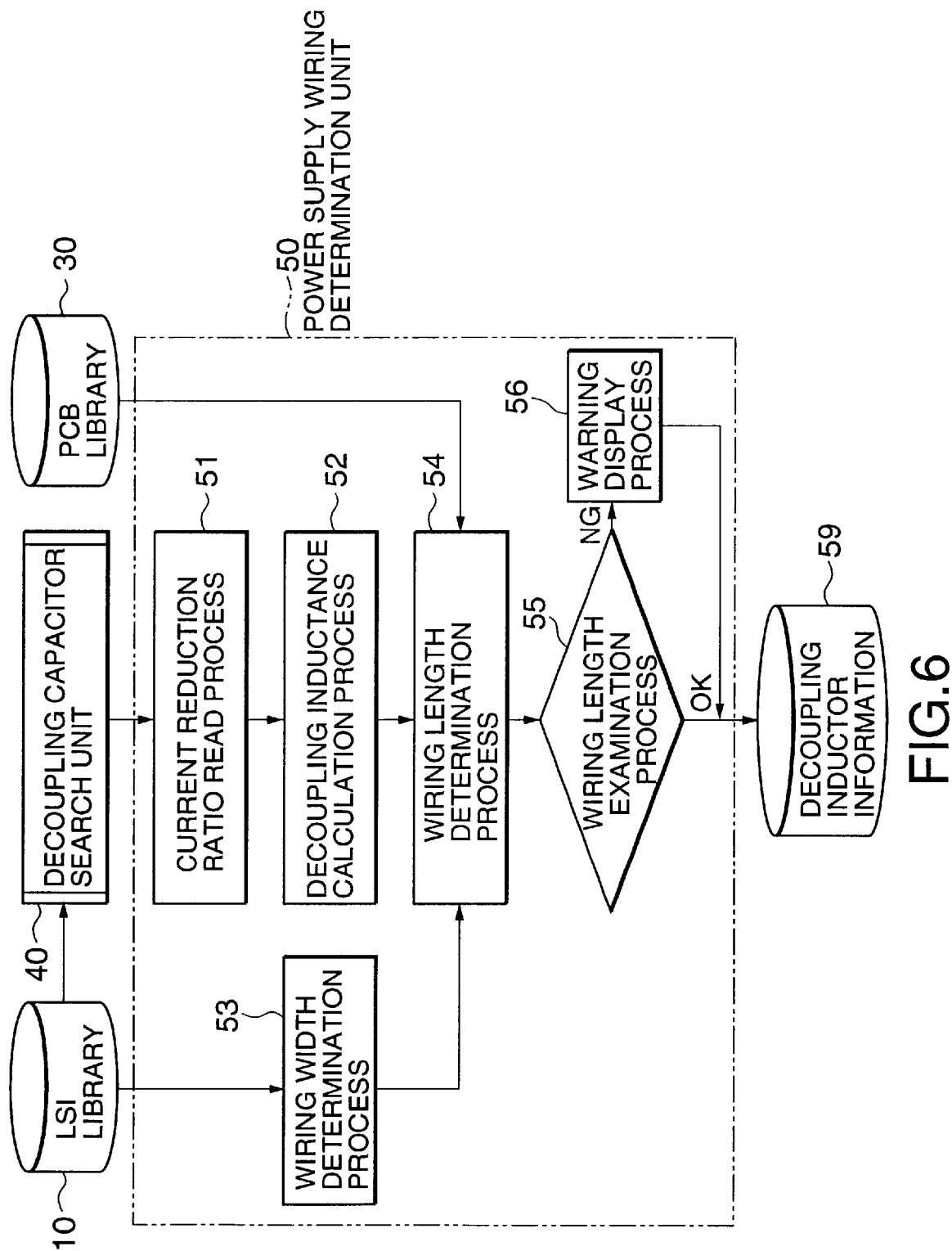
FIG. 6 is a flowchart showing the processing performed by a power supply wiring determination means shown in FIG.

FIG. 6 is a flowchart showing the processing performed by the power wiring determination unit 50 in FIG. 1.

The power wiring determination unit 50 performs a current reduction ratio read process 51, which follows the decoupling capacitor searching process 40; a decoupling inductance calculation process 2, for employing the current reduction ratio obtained in the current reduction ratio read process 51; and a wiring width determination process 53, for employing the LSI library 10.

The power wiring determination unit 50 also performs a wiring length determination process 54, for employing the PCB library 30 and the results obtained by the decoupling inductance calculation process 52; a wiring length examination process 55, for the wiring length obtained in the wiring length determination process 54; and a warning display process 56, for employing the results obtained in the wiring length examination process 55. In accordance with the results obtained in the wiring length examination process 55, the wiring length obtained in the wiring length determination process 54 and the contents of the warning displayed in the warning display process 45 are employed as the decoupling inductor information.

Figure 7:
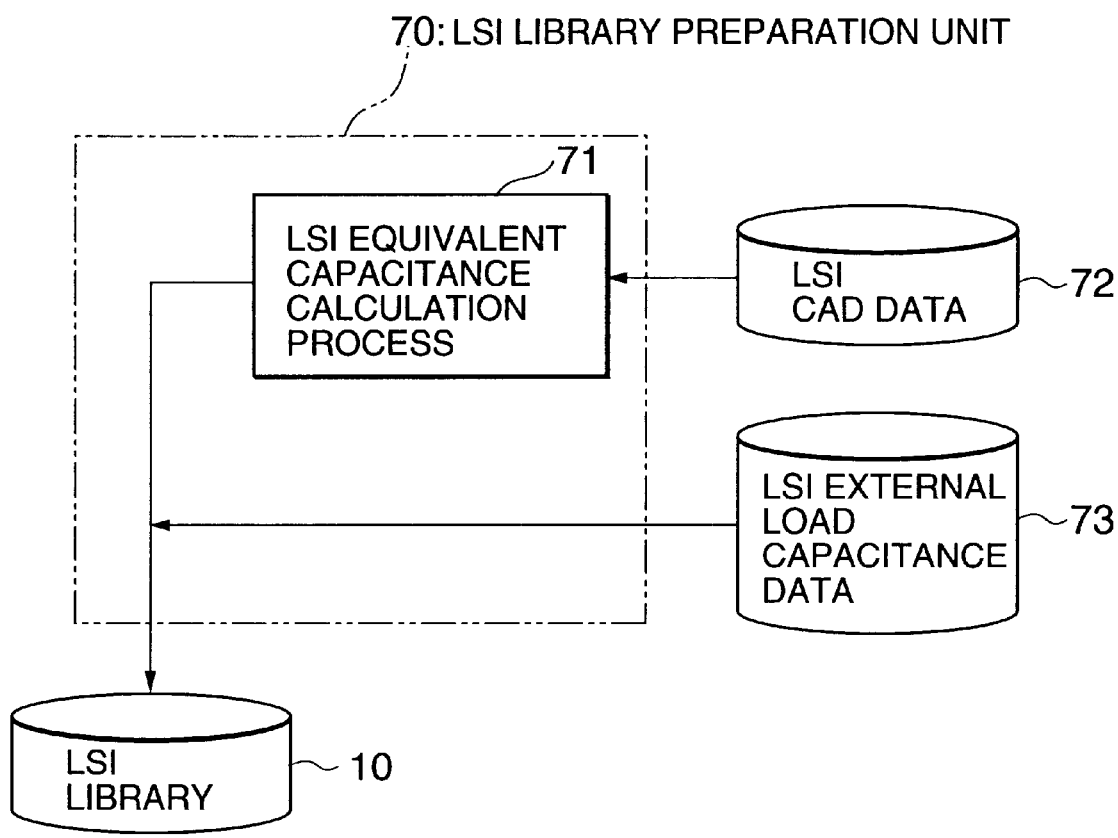
FIG. 7 is a flowchart showing the processing performed by an LSI library preparation means shown in FIG. 1.

FIG. 7 is a flowchart showing the processing performed by the LSI library preparation unit 70 in FIG. 1.

The LSI library preparation unit 70 performs an LSI equivalent capacitance calculation process 71 for employing CAD data 72 of the LSI. The results obtained in the LSI equivalent capacitance calculation process 71 are defined as the internal load capacitance Ci of the LSI, and the capacitance Ci for each LSI is registered in the LSI library 10, together with the external load capacitance Co obtained by using external load capacitance data 73 for the LSI.

The operation performed for this embodiment will now be described.

As is stated above, the power supply decoupling circuit design support. system is activated on the assumption with the registration of the libraries. First, the decoupling capacitor search unit 40 initiates the individual processes (see FIG. 7), and then the decoupling capacitor search unit 40 permits the user to select one decoupling capacitor 21 from the decoupling capacitor library 20.

First, the power supply voltage change value read process 41 is performed. During this process 41, the user enters a permissible change value $\Delta V$ of a direct current voltage Vh at the power supply terminal of each LSI 80. The user need only refer to the function specification for each LSI 80 in order to enter the permissible change value $\Delta V$. Following this, the decoupling capacitor capacitance calculation process 42 is performed to design the decoupling capacitor 21.

Figure 8:
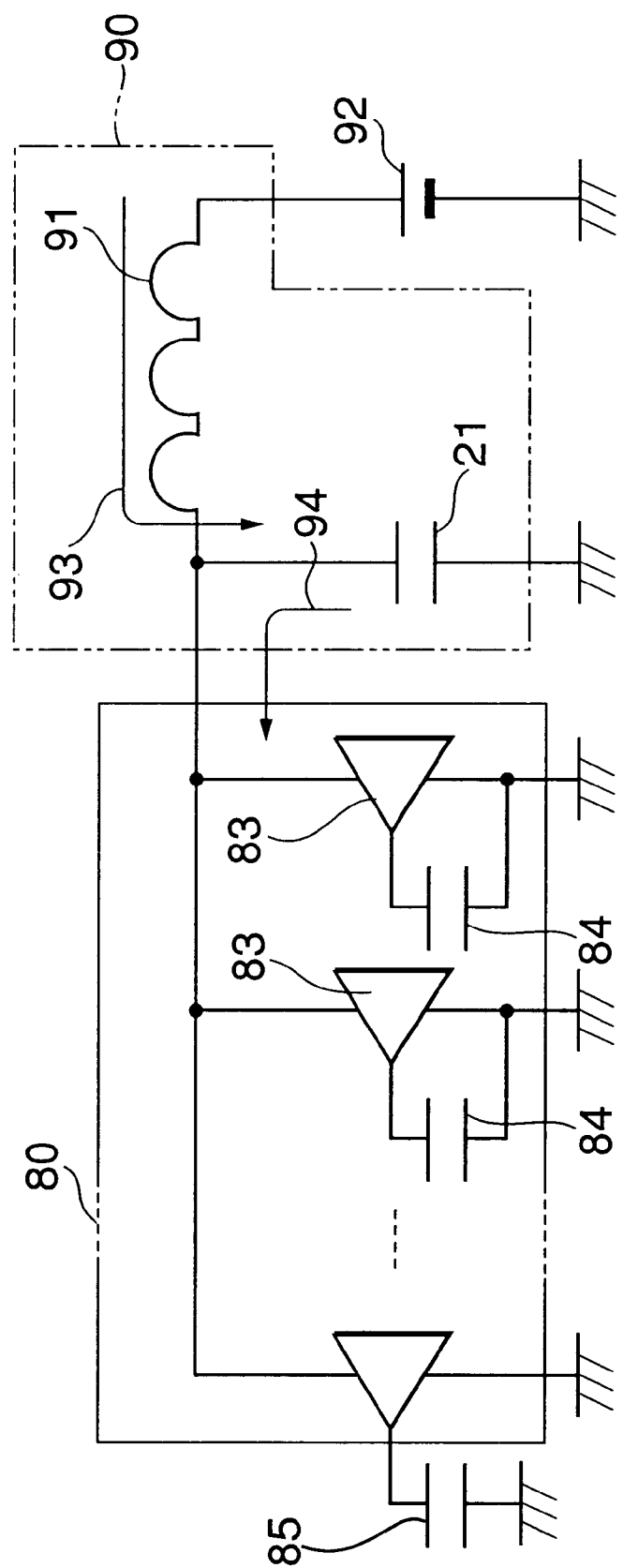
FIG. 8 is a specific diagram showing a power supply decoupling circuit and an LSI.

FIG. 8 is a specific diagram showing the power supply decoupling circuit and the LSI used to explain the decoupling capacitor capacitance calculation process.

A power supply decoupling circuit 90 is an equivalent circuit that includes a decoupling inductor 91, provided by power supply wiring on the printed circuit board, and the decoupling capacitor 21, which is connected to the power supply wiring.

In the power supply decoupling circuit 90, a predetermined charge current 93, from a direct current power supply 92 on the printed circuit board, is supplied via the power supply wiring 22 to the decoupling capacitor 21. Further, a discharge current 94 from the decoupling capacitor 21 is output to the LSI 80. Therefore, the power supply wiring 22 can be designed by using the decoupling inductance, and an equivalent capacitor can be designed from the decoupling capacitor 21.

The LSI 80 includes internal gate circuits 83; parasitic capacitors 84, which are parasitic to the gate circuits 83; and an output capacitor 85, which is connected to the output terminal of the LSI 80. The internal load capacitance Ci is a predetermined value defined by the parasitic capacitors 84, and the external load capacitance Co is a predetermined value defined by the output capacitor According to the LSI 80, upon the switching of the gate circuits 83, a predetermined charges is supplied to each of the parasitic capacitors 84 and the output capacitor 85. When the current 94 discharged by the decoupling capacitor 21 is used as these charges, the EMI due to the power supply wiring 22 can be reduced.

Therefore, the amount of total charges Q obtained by the following expression 1 must be supplied by the decoupling capacitor 21 to the load capacitor Ce of each LSI 80.

$$Q = C \times \Delta V \geq \Sigma Ce \times Vh \qquad \text{Ex. 1}$$

That is, the equivalent capacitance C of the decoupling capacitor 21 must be set to a value that permits all the load capacitors Ce to be charged, and the charges Q must be supplied so that all the LSIs 80 can be operated.

Therefore, in expression 1, the charge output by the decoupling capacitor 21 is set equal to the total amount of the charges Q, and also the value on the left side of the inequality is set equal to or greater than the value on the right side, which is the total of the charges for all the load capacitors Ce. It should be noted that the decoupling inductance C for the wiring 22 is sufficiently greater than the inductance of the internal wiring for the LSI 80.

Since the load capacitance Ce is the sum of the external load capacitance Co and the internal load capacitance Ci of the LSI 80, expression 1 can be changed to expression 2, and furthermore, expression 3 can be obtained.

$$C \times \Delta V \geq (YCo + \Sigma Ci) \times Vh \qquad \text{Ex. 2}$$

$$C \geq (\Sigma Co + \Sigma Ci) \times Vh / \Delta V \qquad \text{Ex. 3}$$

Therefore, the right side of expression 3 is calculated by using the decoupling capacitor capacitance calculation process 42, and the lower limit value of the equivalent capacitance C is obtained. Following this, the decoupling capacitor library search process 43 is performed by using the calculation results, and a search of the decoupling capacitor library 20 is made for the decoupling capacitor 21, which has the equivalent capacitance C that satisfies the expression 3.

Sequentially thereafter, the decoupling capacitor library examination process 44 is performed. During the performance of this process 44, a check is performed to determine whether the decoupling capacitor 21, which satisfies expression 3, is present in the decoupling capacitor library 20. If an appropriate decoupling capacitor 21 is found (OK), the decoupling capacitor information 49, including the pertinent number, is edited and is transmitted to the power supply wiring determination unit 50.

If the decoupling capacitor 21 that satisfies expression 3 is not found in the decoupling capacitor library 20 (NG), the warning display process 45 is performed for the user. A predetermined warning message is presented on a display device (not shown), and the decoupling capacitor capacitance calculation process 42 is repeated to permit the user to select another decoupling capacitor 21 having a value that is approximately the same as expression 3. In this manner, the decoupling capacitor 21 can be designated by the decoupling capacitor search unit 40.

The power supply wiring determination unit 50 will now be explained.

The power supply wiring determination unit 50 shown in FIG. 6 employs the decoupling capacitor information 49, which is determined by the decoupling capacitor search unit 40, to design the power supply wiring 22 for the power supply decoupling circuit.

In this case, it is important that a value Ips, which is set to the discharge current 94 output to the LSI 80, be considerably smaller than the value Ic of the charge current 93 input to the decoupling capacitor 21. Therefore, the current reduction ratio N of the output value Ips to the input value Ic is defined.

First, the current reduction ration process 51 is performed to obtain the current reduction ratio N. During this process 51, the current reduction ratio N, which is entered by the user, is read and is transmitted to the succeeding, decoupling inductance calculation process 52.

During the decoupling inductance calculation process 52, the equivalent capacitance C of the decoupling capacitor 21 is extracted from the decoupling capacitor information 49, and the spectrum Ic(f) of the input value Ic for the decoupling capacitor 21 is calculated.

The result is divided by the current reduction ratio N, using expression 4 to obtain the spectrum Ips(f) of the output value Ips. Then, a frequency band B that covers, as the target design, from the lower limit frequency fdw to the upper limit frequency fup is examined to determine whether expression 4 has been established.

$$Ic(f) \geq N \times Ips(f) \qquad \text{Ex. 4}$$

Further, according to expression 4, this relationship is equivalent to the relationship, represented by equation 5, between an impedance Z1 of the power supply wiring 22 and an impedance Zc of the decoupling capacitor 21 in the target frequency band B.

$$Z1 \geq N \times Zc \qquad \text{Ex. 5}$$

Figure 9A:
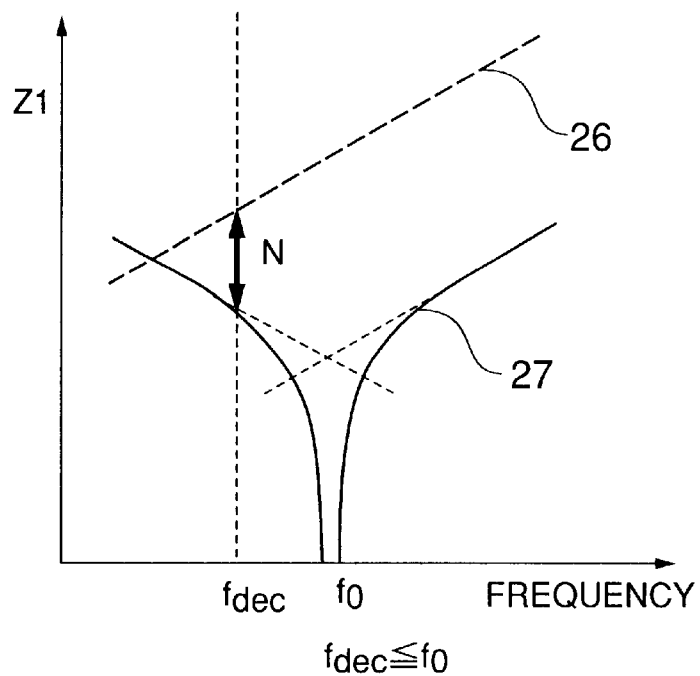
FIGS. 9A and 9B are graphs for explaining the frequency property of the impedance provided by the power supply wiring and the decoupling capacitor shown in FIG. 8.
Figure 9B:
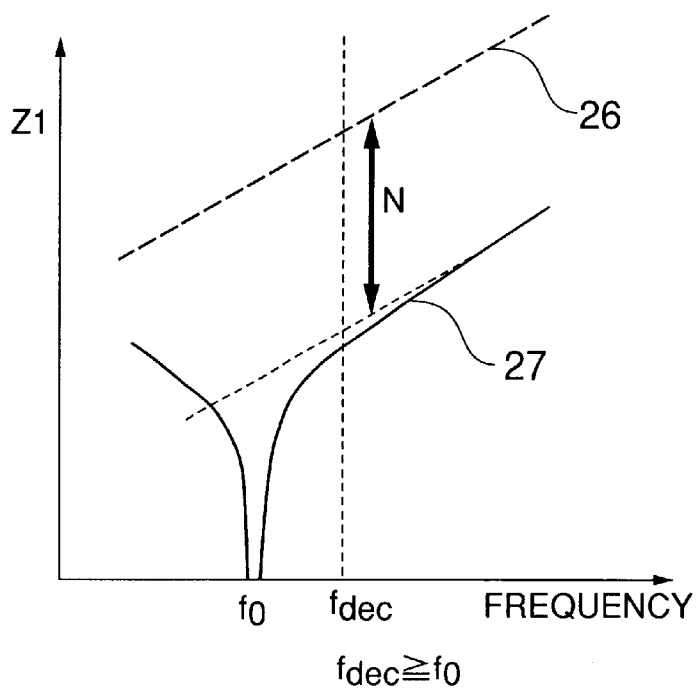

FIGS. 9A and 9B are graphs for explaining the frequency property of the impedance provided by the power supply wiring and the decoupling capacitor in FIG. 8.

For a frequency property 27 (solid line), the absolute value of the impedance Zc of the decoupling capacitor 21 is indicated. As is described above, the structure of the series circuit (the capacitance Cp, the resistance Rp and the inductance Lp) is employed as an equivalent circuit model (see FIG. 3) for the decoupling capacitor 21.

Thus, with the self-resonant frequency of of the decoupling capacitor 21 serving as a boundary, the frequency property 27 (solid line) is inductive in one frequency area (fdec ≧ f0), and is capacitive in the other frequency area (fdec ≦ f0). Therefore, the condition for the establishment of expression 5 is the establishment of the relations in expressions 6 and 7 for the decoupling inductance L of the power supply wiring 22.

$$L \geq N \times Lp: (fdec \geq f0) \qquad \text{Ex. 6}$$

$$L \geq N / \{(2\pi fdec)2 \times Cp\} : (fdec \leq fO) \qquad \text{Ex. 7}$$

The lower limit frequency fdw is the lower limit value of the target frequency band B for the EMI reduction using the power supply decoupling circuit. The lower limit frequency fdw can be determined in the following manner. First, since the lower limit frequency fdw is not restricted if it is lower than the lower limit value in the target band for the EMI rule restriction, a value higher than the lower limit value must only be employed for the lower limit frequency fdec.

Further, so long as its spectrum is examined, the EMI caused by an electromagnetic wave substantially includes high frequency elements that are accompanied by the operating frequency of the LSI 80. Therefore, the EMI in a band lower than the operating frequency may be ignored, and a higher value for either the lower limit value of the restricted band or the operating frequency of the LSI 80, is employed as the lower limit frequency fdw for the target frequency band B.

For example, the current EMI restrictive band in Japan is 30 MHz to 1 GHz, and when the operating frequency of an LSI 80 is 25 MHz, a band of 30 MHz to 1 GHz is defined as the target frequency band B of the power supply decoupling circuit. This is because 30 MHz is the lower limit frequency fdw. But when the operating frequency of an LSI 80 is 50 MHz, this is used as the lower limit frequency fdw, and a band of 50 MHz to 1 GHz can be used as the target frequency band B.

The wiring width determination process 53 is performed in parallel with the decoupling inductance calculation process 52. During the wiring width determination process 53, the average consumed current Iave for the registered LSI 80 is obtained from the LSI library 10, and the wiring width W of the power supply wiring 22 that satisfies expression 8 is determined.

$$W \geq K \times Iave \qquad \text{Ex. 8}$$

where K denotes the minimum value for the wiring width W that is permitted for the unit current of the average consumed current Iave.

Sequentially, the wiring length determination process 54 is performed by using the writing width W and the decoupling inductance L, which are respectively obtained during the wiring width determination process 53 and the decoupling inductance calculation process 52. In the wiring length determination process 54, the PCB library 30 is examined using the wiring width W, and the unit inductance Lunit is obtained in accordance with the wiring structure of the pertinent printed circuit board. Then, using expression 9, the decoupling inductance L is divided by the unit inductance Lunit to acquire the wiring length lp of the power supply wiring 22.

$$lp = L/Lunit \qquad \text{Ex. 9}$$

Following this, the wiring length examination process 55 is performed by using the wiring length lp that is obtained during the performance of the wiring length determination process 54. For the wiring length examination process 55, a writing length upper limit value Lmax is set in advance, and whether the wiring length lp is longer than the upper limit value Lmax is determined. If the wiring length lp is not longer (OK), the wiring width W and the writing length lp are filed as decoupling inductance information 59. If the wiring length lp is too long (NG), the warning display process 45 is performed to provide a predetermined warning for the designer, and the wiring width W and the wiring length lp are also filed.

Once the wiring layout is determined, the wiring length upper limit value Lmax is automatically provided as the limit value for the wiring design of the printed circuit board. And then expression 10 is used to obtain the wiring length upper limit value Lmax by multiplying a wiring length upper limit coefficient $\alpha$ by the wavelength $\lambda$ of the upper limit frequency fmax in the target frequency band B.

$$Lmax = \alpha \times \lambda \qquad \text{Ex. 10}$$

where the designer can set an arbitrary value for $\alpha$ in accordance with his or her prior experience.

Therefore, the decoupling inductor information 59 for the power supply wiring 22 on the printed circuit board is determined, and is transmitted to the circuit design results output unit 60 (see FIG. 1), together with other information required for the designing of the power supply decoupling circuit. The circuit design results output unit 60 outputs desired design result information for each power supply terminal of the LSI 80 to the display device or to the storage device, or to another storage device (none of them shown).

The design results information includes the decoupling capacitor information (the part name, including the part number, the capacitance, the resistance and the inductance) and the decoupling inductor information (the wiring structure of the power supply wiring, the wiring length and the wiring width). Therefore, when the design results are read by an automatic wiring layout device (a so-called CAD) (not shown), the power supply wiring 22 for all the LSIs on the printed circuit board can be automatically laid out.

Figure 10:
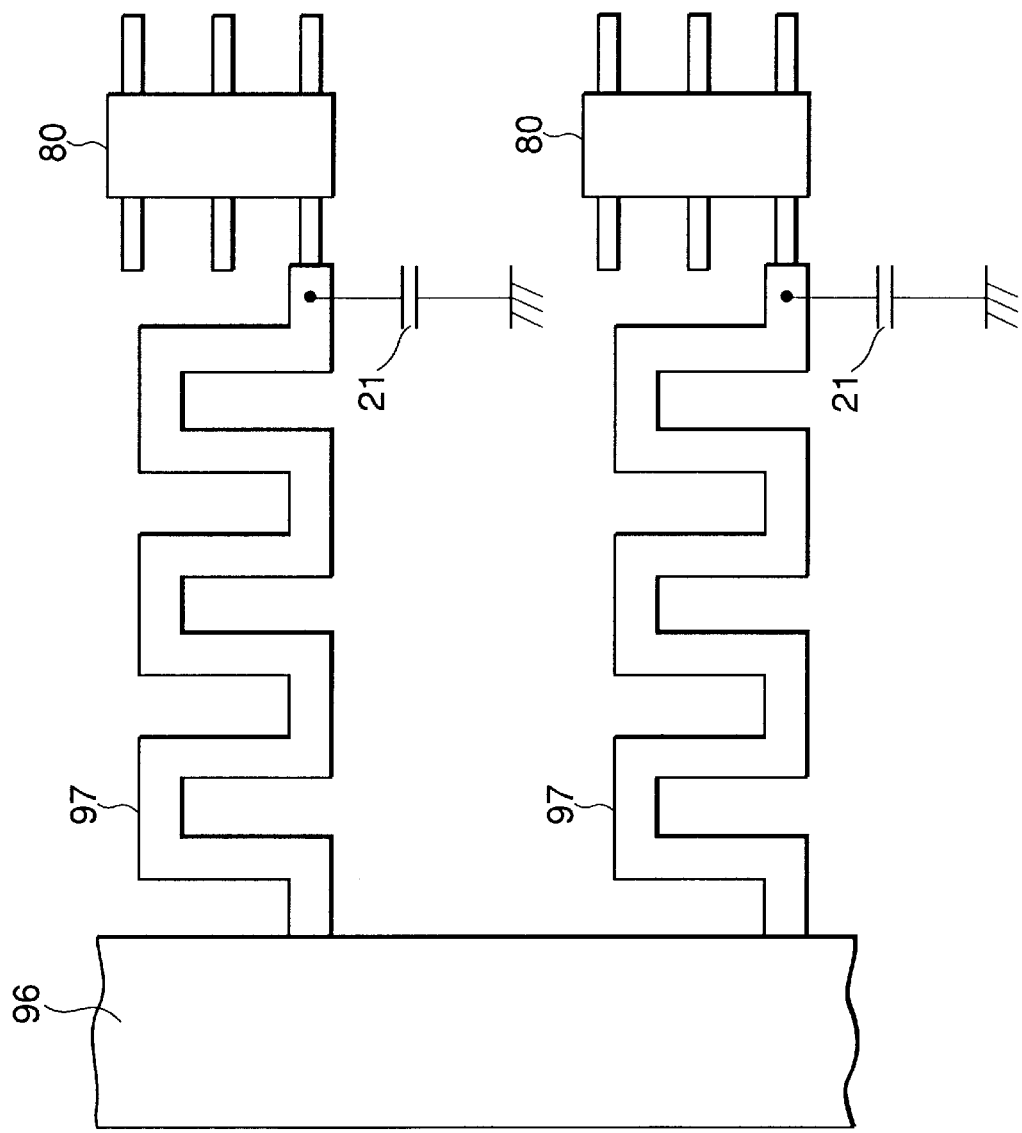
FIG. 10 is a partially enlarged diagram showing an example layout for the power supply wiring shown in FIG. 8.

FIG. 10 is a partially enlarged diagram of the wiring layout for the power supply wiring in FIG. 8.

In this wiring layout are shown a trunk line 96, which is connected to the direct current power supply 92, two branch lines 97, which branch off from the trunk line 96, and the decoupling capacitors 21, which are connected to the branch lines 97.

The designer determines in advance the wiring layout for all the LSIs 80 and the trunk line 96, and designs the branch lines 97 and the decoupling capacitor 21 by using the circuit design results. In this wiring layout, the branch lines 97 are laid out using a zigzag design in order to reduce the sizes of their layout areas.

Figure 11A:
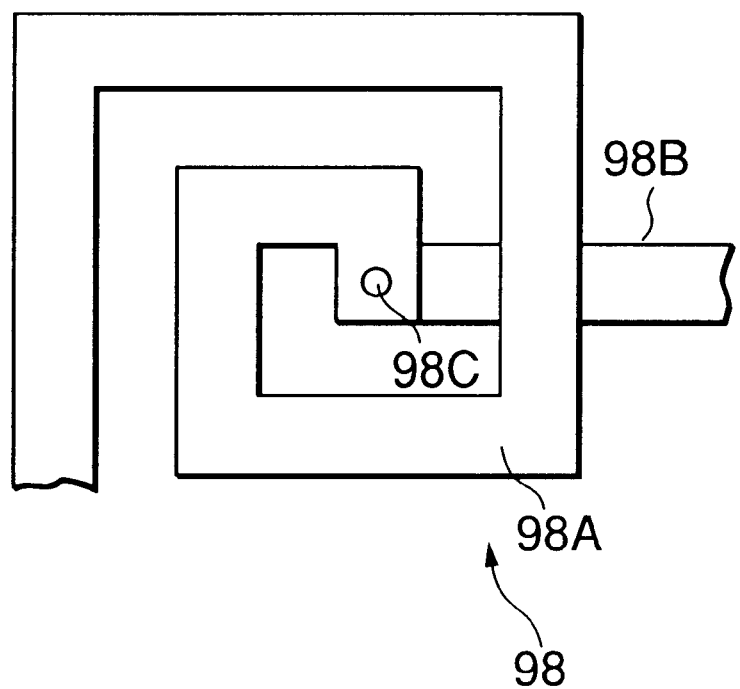
FIGS. 11A and 11B are partially enlarged diagrams showing other example layouts for the power supply wiring shown in FIG. 8.
Figure 11B:
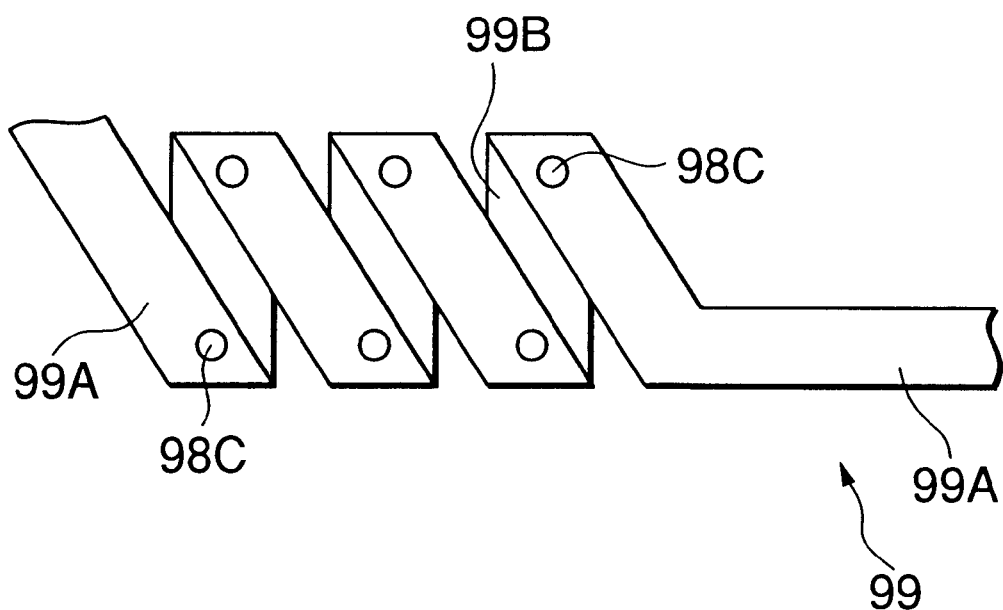

FIGS. 11A and 11B are partially enlarged diagrams showing other example designs used for the wiring layout in FIG. 10. A volute branch line is shown in FIG. 11A, and a spiral branch line is shown in FIG. 11B.

In these wiring layouts, a branch line 98 or 99 is formed at different heights to provide a two-layer structure constituting two wiring patterns.

The branch line 98 in FIG. 11A is so designed that a wiring pattern 98A on one face of a substrate layer is formed as a volute from the center to the periphery, and is connected to a wiring pattern 98B on the other face via a through hole 61. And the branch line 99 in FIG. 11B is so designed that a wiring pattern 99A is connected to another wiring pattern 99B via through holes 98C to form a line that overall has a spiral shape.

As is described above, the load capacitance Ce is obtained as the sum of the internal load capacitance Ci of each gate circuit of the LSI 80 and the external load capacitance Co of the LSI 80. However, substantially, not all the gate circuits are operated at the same time. Rather, it is normal for an external input signal and an internal clock signal to be combined and for each gate circuit to be sequentially operated at a different operating timing in order to charge or to discharge each load capacitor. Therefore, it is preferable that the value for the normal operation be used as the load capacitance Ce.

Figure 12:
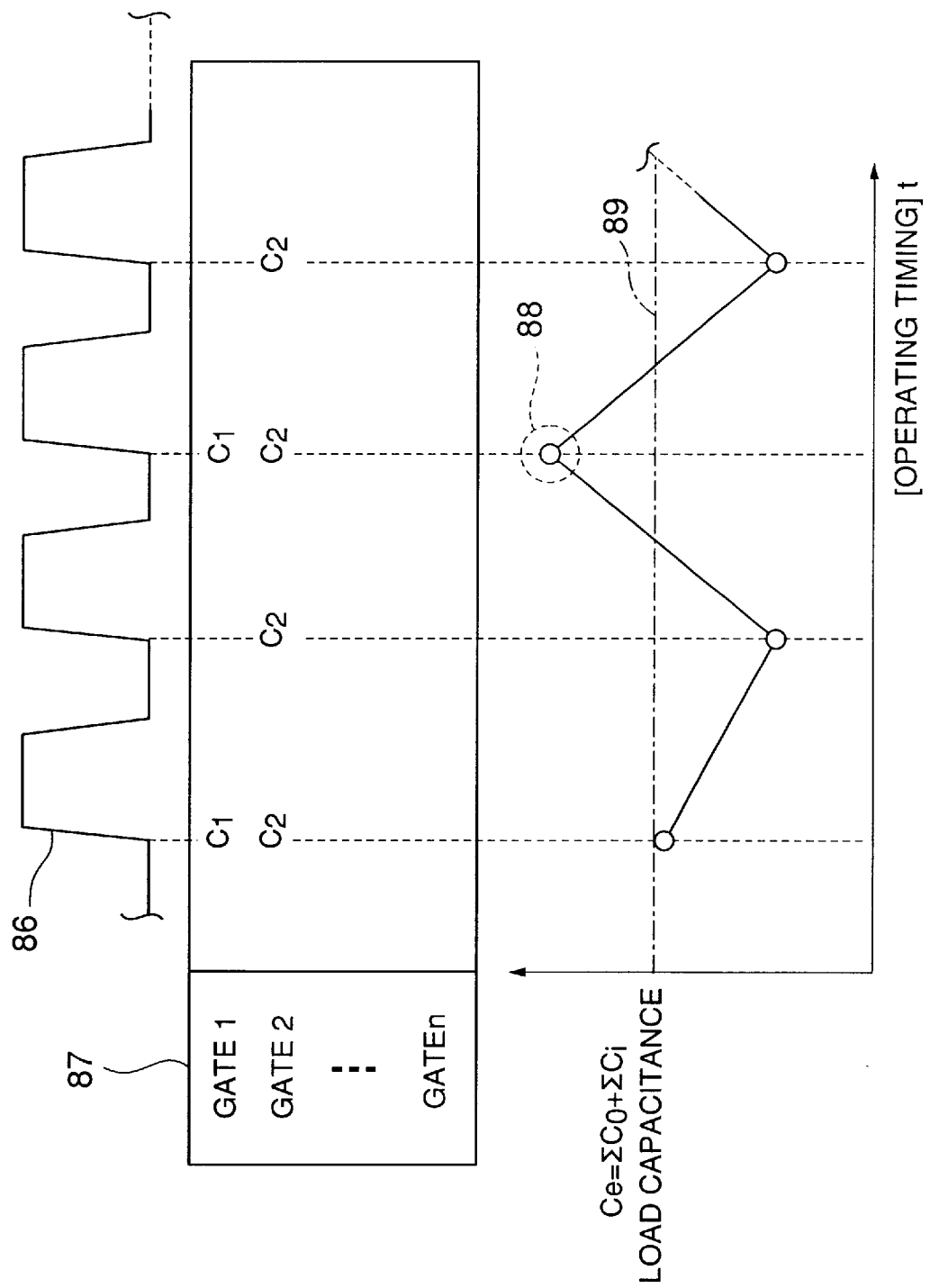
FIG. 12 is a diagram for explaining another example for the LSI library preparation means shown in FIG. 7.

FIG. 12 is a diagram for explaining another example of the LSI library preparation unit in FIG. 7.

The LSI library preparation unit has a table 87 in which a combination of operating gate circuits (gate 1, 2, . . . and n) is arranged in accordance with each operating timing 86. While the table 87 is examined during the performance of another LSI equivalent capacitance calculation process, the load capacitance Ce is obtained for each operating timing 86.

Among the obtained load capacitances Ce, a maximum value 88 and an average value 89 can be selected. Therefore, an equivalent capacitance Ce can be obtained that is more practical than is that which is obtained using the previously mentioned LSI equivalent capacitance calculation process, and a rough estimate value that is greater than necessary is not employed.

Another example of an equivalent circuit model used for the decoupling capacitor will now be described.

In this model, the inductance of a connection pad, which is one of the wiring patterns of the printed circuit board and which connects the decoupling capacitor 21, is also obtained in advance. Then, the following expression 11 is employed to add the inductance of the connection pad to the inductance Lp of the inductor 24.

$$Lpp = Lp + Lpad \qquad \text{Ex. 11}$$

According to the equivalent circuit model, new inductance Lpp, which is the result obtained by the addition can be defined as the decoupling capacitor information 49, and can be stored in the decoupling capacitor library 20. Therefore, the affect on the connection pad of the printed circuit board can be taken into account for the design, and as a result, the wiring length lp of the power supply wiring can be a small value that is nearly the same as the actual value.

As has been described in detail, according to the method for designing the power supply decoupling circuit of this invention, an optimal decoupling capacitor can be automatically selected based on the load capacitances of the gate circuits of the LSI. Further, since the impedance of the decoupling inductor of the power supply wiring can be set higher than the impedance of the decoupling capacitor, and since the optimal wiring length can be determined for each LSI, a practical design for the power supply decoupling circuit can be implemented.

Although the invention has been described while referring to a specific embodiment, from this it should not be inferred the description is intended to in any way limit the application of the invention. Furthermore, since when reading the description of the invention while referring to the accompanying drawings, various modifications of the disclosed embodiments will become apparent to persons skilled in the art, it is therefore contemplated that the appended claims will cover any modifications or embodiments that fall within the true scope of the invention.

What is claimed is:

1. A power supply decoupling circuit design method, for a printed circuit board wiring pattern for power wiring, which is extended from a power terminal of a semiconductor integrated circuit to a power supply layer or to a main power line, for a printed circuit board to which a direct current is supplied by one of said power supply layers and said main power line, and for designing a power decoupling capacitor that is located between said power terminal and either a ground layer or ground wiring for said printed circuit board, comprising the steps of:

setting, in advance, an electric charge that flows from a direct current power source to said power terminal in response to the operation of said semiconductor integrated circuit, a direct current voltage for said direct current and a terminal voltage for said power terminal, a permissible voltage change in said power supply decoupling circuit, and a ratio for a current reduction in a high frequency element that is accompanied by the operation of said semiconductor integrated circuit;

dividing said electric charge by said terminal voltage to obtain a load capacitance for said semiconductor integrated circuit;

multiplying said direct current voltage by said load capacitance and dividing the product by said permissible voltage change;

designing said power supply decoupling capacitor using the results of said division;

multiplying said current reduction ratio by an impedance obtained from said power supply decoupling capacitor; and designing said printed circuit board wiring pattern using a power supply decoupling inductor obtained by applying the results of said multiplication.

2. A power supply decoupling circuit design method according to claim 1, wherein said load capacitance is the sum of an external load capacitance applied to an output terminal of said semiconductor integrated circuit, and an internal load capacitance of each of said gate circuits that constitute said semiconductor integrated circuit.

3. A power supply decoupling circuit design method according to claim 2, wherein said load capacitance is the maximum value of the sum of said external load capacitance and said internal load capacitance, for which charging is performed at multiple operating timings for said semiconductor integrated circuit.

4. A power supply decoupling circuit design method according to claim 2, wherein said load capacitance is the average value of the sum of said external load capacitance and said internal load capacitance, for which charging is performed at multiple operating timings for said semiconductor integrated circuit.

5. A power supply decoupling circuit design method according to claim 1, wherein, when a lower limit frequency of a target frequency band to be designed is set equal to or lower than a self-resonant frequency of said power supply decoupling capacitor, said power supply decoupling inductor is determined using a capacitive impedance that is the impedance of said power supply decoupling capacitor.

6. A power supply decoupling circuit design method according to claim 1, wherein, when a lower limit frequency of a target frequency band to be designed is set equal to or higher than a self-resonant frequency of said power supply decoupling capacitor, said power supply decoupling inductor is determined using an inductive impedance that is the impedance of said power supply decoupling capacitor.

7. A power supply decoupling circuit design method according to claim 6, wherein said power supply decoupling inductor is determined by an impedance that is the sum of a series of inductance elements of said power supply decoupling capacitor and the inductance of a connection pad that is used for connection of said power supply coupling capacitor.

8. A power supply decoupling circuit design method according to claim 1, wherein a wiring length of said printed circuit board wiring pattern is determined by the inductances that are obtained from the thickness of a conductor of said printed circuit board wiring pattern, a wiring width, and the thickness of a dielectric member and a permeability of said dielectric member.

* * * * *